(12) United States Patent
Burghartz et al.

(10) Patent No.: US 8,309,924 B2
(45) Date of Patent: Nov. 13, 2012

(54) CIRCUIT ARRANGEMENT AND IMAGING PYROMETER FOR GENERATING LIGHT- AND TEMPERATURE-DEPENDENT SIGNALS

(75) Inventors: Joachim N. Burghartz, Leinfelden-Echterdingen (DE); Franz Xaver Hutter, Stuttgart (DE); Daniel Brosch, Reutlingen (DE); Heinz-Gerhard Graf, Magstadt (DE)

(73) Assignee: Institut fuer Mikroelektronik Stuttgart, Stuttgart (DE)

( * ) Notice: Subject to any disclaimer, the term of this patent is extended or adjusted under 35 U.S.C. 154(b) by 155 days.

(21) Appl. No.: 12/773,349

(22) Filed: May 4, 2010

(65) Prior Publication Data

US 2010/0278212 A1    Nov. 4, 2010

Related U.S. Application Data

(63) Continuation of application No. PCT/EP2008/009167, filed on Oct. 30, 2008.

(30) Foreign Application Priority Data

Nov. 5, 2007    (DE) .......................... 10 2007 054 314

(51) Int. Cl.
    *H01L 25/00*    (2006.01)
(52) U.S. Cl. ....................................................... 250/332
(58) Field of Classification Search .......... 250/330–335, 250/336.1–336.2, 338.1–338.5, 339.1–339.15, 250/340, 341.1–341.8
    See application file for complete search history.

(56) References Cited

U.S. PATENT DOCUMENTS

| | | | |
|---|---|---|---|
| 3,435,237 A | | 3/1969 | Collins |
| 4,413,324 A | | 11/1983 | Tatsuwaki et al. |
| 4,570,332 A | | 2/1986 | Yamauchi |
| 4,924,478 A | * | 5/1990 | Tank .............................. 374/121 |
| 5,608,204 A | | 3/1997 | Höfflinger et al. |
| 5,963,311 A | * | 10/1999 | Craig et al. ..................... 356/43 |
| 6,034,369 A | * | 3/2000 | Oda ........................... 250/338.1 |

(Continued)

FOREIGN PATENT DOCUMENTS

DE    867 453    2/1953

(Continued)

OTHER PUBLICATIONS

Y. Zhang, "Conception of a high-speed digital color imaging device," 2005, SPIE Proceedings, vol. 5920, pp. 592010-1 t0 592010-10.*

(Continued)

*Primary Examiner* — Kiho Kim
(74) *Attorney, Agent, or Firm* — Harness, Dickey & Pierce, P.L.C.

(57) ABSTRACT

A circuit arrangement for generating light-dependent and temperature-dependent signals has a number of first and second sensor elements, which generate a number of first and second electrical signals. The first and second electrical signals depend on electromagnetic radiation impinging on the circuit arrangement. The first sensor elements are designed to generate the first electrical signals in a manner dependent on electromagnetic radiation from a first wavelength range which comprises a substantial part of the visible light. The second sensor elements are designed to generate the second electrical signals in a manner dependent on electromagnetic radiation from a second wavelength range which predominantly comprises infrared radiation. The first wavelength range overlaps the second wavelength range and it therefore also comprises infrared radiation.

17 Claims, 3 Drawing Sheets

U.S. PATENT DOCUMENTS

| | | | |
|---|---|---|---|
| 7,247,851 B2 * | 7/2007 | Okada et al. | 250/339.02 |
| 2003/0108083 A1 | 6/2003 | Seitz | |
| 2006/0114551 A1 | 6/2006 | Okada et al. | |
| 2007/0145273 A1 * | 6/2007 | Chang | 250/338.1 |
| 2008/0315104 A1 * | 12/2008 | Nam | 250/370.08 |

FOREIGN PATENT DOCUMENTS

| | | |
|---|---|---|
| DE | 1 136 135 | 9/1962 |
| DE | 1 237 804 | 10/1967 |
| DE | 24 27 892 | 12/1975 |
| DE | 33 17 108 A1 | 11/1983 |
| DE | 42 09 536 A1 | 9/1993 |
| DE | 196 50 705 A1 | 6/1998 |
| DE | 10 2006 013 168 A1 | 10/2006 |
| EP | 1 134 565 A1 | 9/2001 |
| EP | 1 630 871 A1 | 3/2006 |
| GB | 1 507 367 | 4/1978 |
| GB | 2 183 028 A | 5/1987 |

OTHER PUBLICATIONS

X. Maldague et al., Dual imager and its applications to active vision robot welding, surface inspection, and two-color pyrometry, Aug. 1989, pp. 872-880.

* cited by examiner

CIRCUIT ARRANGEMENT AND IMAGING PYROMETER FOR GENERATING LIGHT- AND TEMPERATURE-DEPENDENT SIGNALS

CROSSREFERENCES TO RELATED APPLICATIONS

This application is a continuation of international patent application PCT/EP2008/009167 filed on Oct. 30, 2008 designating the U.S., which international patent application has been published in German language and claims priority from German patent application DE 10 2007 054 314.1 filed on Nov. 5, 2007. The entire contents of these priority applications are incorporated herein by reference.

BACKGROUND OF THE INVENTION

The present invention relates to a circuit arrangement for generating light- and temperature-dependent signals representing properties of an object or a scene. The invention also relates to an imaging pyrometer comprising such a circuit arrangement.

EP 1 134 565 B1 describes an imaging pyrometer which can be used to determine surface temperature distributions of objects in a scene. In addition, this known pyrometer supplies a "normal" optical image of the scene. This is achieved by virtue of the known pyrometer having an optoelectronic sensor comprising a plurality of sensor elements, which are referred to as pixels in the document. The optoelectronic sensor has three different types of sensor elements, which are arranged on the surface of the sensor in an alternating fashion. A first type of sensor elements is designed to generate electrical signals dependent on electromagnetic radiation originating from a very narrowband wavelength range around 1.06 µm. A second type of sensor elements is designed to generate electrical signals dependent on electromagnetic radiation from a second narrowband wavelength range around 0.99 µm. The two narrowband wavelength ranges each contain a small part of the infrared spectrum. A third type of sensor elements is designed to generate electrical signals dependent on electromagnetic radiation from a relatively broadband wavelength range comprising substantially only visible light. The electrical signals from the two infrared ranges are used to determine temperatures according to an algorithm such as is described in U.S. Pat. No. 4,413,324 for example. This involves a quotient method, in which a quotient of the signals from the two narrowband infrared ranges is formed in order to eliminate the emission properties of the surface whose temperature is determined. Merely the "normal" optical image of the observed scene is generated by means of the third electrical signals from the wavelength range of visible light.

The known sensor therefore has three different types of sensor elements, which have to be produced in at least partly different process steps and which have to be distributed on the surface of the sensor. Consequently, the production of the known sensor is rather complicated and expensive. On the other hand, the resolution of the known sensor is limited both with regard to the visual image and with regard to the temperature distribution because the different sensor elements are arranged side by side on the surface of the sensor, such that between two sensor elements of the same type there are in each case "gaps" occupied by sensor elements of a different type. The limited resolution is disadvantageous if one would like to determine geometrical properties of a recorded object on the basis of the optical image, for example. Finally, the dynamic range of the sensor elements is also limited in the case of the known sensor, such that several different exposure times may be required depending on the temperatures and radiation intensities in the observed scene. Consequently, the image recording can be cumbersome.

U.S. Pat. No. 4,413,324, already cited above, discloses a quotient pyrometer comprising a plurality of sensor elements which record electromagnetic radiation in two different wavelength ranges, which are narrowband in each case. The known pyrometer allows to determine a temperature distribution, but it does not allow to record a "normal" optical image of the observed scene.

Furthermore, quotient pyrometers have been known for many years from various documents. By way of example, reference is made to DE 12 37 804 A1, which proposes to determine a logarithm of the measured values at first and to calculate a difference between the logarithms thereafter, with the difference corresponding to the logarithm of the quotient. Said document proposes recording electromagnetic radiation from the red and from the blue wavelength ranges. A similar proposal is found in DE 867 453, wherein electromagnetic radiation from the red and from the green wavelength ranges are to be recorded.

DE 24 27 892 A1 discloses a quotient pyrometer, where the actual temperature in a scene is determined by means of a separate temperature radiator, which provides a reference value for the temperature determination.

DE 11 36 135 A discloses a quotient pyrometer, where a photoelement made of silicon is arranged upstream of a germanium diode in the direction of radiation. The silicon acts as a filter element and allows to pass through predominantly only radiation having a wavelength of greater than 1.2 µm. The germanium diode has a maximum sensitivity in the wavelength range around 1.5 µm. The maximum sensitivity of the photoelement of silicon is approximately 0.9 µm. The temperature in the observed scene is determined from the signals of the two sensor elements.

DE 33 17 108 A1 discloses a thin-film semiconductor component used as a solar cell, for instance. The thin-film semiconductor component is constructed in a layered fashion on a semiconductor substrate.

DE 196 50 705 A1 discloses a camera comprising a plurality of sensor elements arranged one above another in a stacked fashion. By way of example, a color matrix sensor and a black-and-white matrix sensor are arranged vertically one above the other and aligned pixel by pixel with one another. The pn junctions—stacked in the depth—of the sensors react to different wavelengths since the longer the wavelength, the more deeply optical wavelengths penetrate into the material.

Finally, DE 42 09 536 A1 discloses an image cell for an image recorder chip, where a photodiode and a MOS transistor are connected to one another in such a way that charge carriers generated in the photodiode flow away through the channel of the MOS transistor. The MOS transistor is operated in what is called sub-threshold range, which has the consequence that the electrical output signal of the image cell is logarithmically dependent on the intensity of the impinging radiation. This known image cell therefore allows to record highly dynamic light signals. Image recorder chips having this technology are commercially offered by the present applicant under the trade name HDRC®.

SUMMARY OF THE INVENTION

Against the background, it is an object of the present invention to provide a circuit arrangement for generating light- and temperature-dependent signals, which circuit arrangement can be used to determine several properties or features of objects, including radiation-dependent properties or features, with high accuracy and in a cost-effective manner.

It is another object of the invention to provide a circuit arrangement which makes it possible to build an imaging pyrometer in a cost-effective manner.

In accordance with an aspect of the invention, there is provided a circuit arrangement for generating light-dependent and temperature-dependent signals representing properties of a scene, the circuit arrangement comprising a number of first and second sensor elements which generate a number of first and second electrical signals that are dependent on impinging electromagnetic radiation, wherein the first sensor elements are designed to generate the first electrical signals in a manner dependent on electromagnetic radiation from a first wavelength range comprising a large part of visible light, wherein the second sensor elements are designed to generate the second electrical signals in a manner dependent on electromagnetic radiation from a second wavelength range predominantly comprising infrared radiation, and wherein the first wavelength range overlaps the second wavelength range and therefore also comprises infrared radiation.

According to another aspect, there is provided circuit arrangement for generating a first and a second image from an object, the first image representing a visual image of the object and the second image representing a temperature distribution of the object, the circuit arrangement comprising an array of first and second sensor elements each configured for receiving electromagnetic radiation and for generating electrical signals depending on the electromagnetic radiation, and a circuit part for processing the electrical signals form the first and second sensor elements in order to generate the first and second images, wherein the electromagnetic radiation comprises a plurality of wavelengths defining a first and a second range of wavelengths, wherein the first and second sensor elements each comprise a photodiode and at least one MOS transistor having a gate terminal, two further terminals and a channel, the gate terminal being conductively connected to one of the two further terminals, and the photodiode being coupled to the MOS transistor so as to drain charge carriers generated in the photodiode on account of the electromagnetic radiation into the channel in order to produce the electrical signals, wherein the first sensor elements are designed to generate a plurality of first electrical signals as a function of the electromagnetic radiation from the first range of wavelengths, wherein the second sensor elements are designed to generate a plurality of second electrical signals as a function of the electromagnetic radiation from the second range of wavelengths, wherein the first range of wavelengths overlaps the second range of wavelengths and comprises wavelengths representing both visible light and infrared radiation, and wherein the second range of wavelengths comprises wavelengths representing mainly infrared radiation.

According to yet another aspect, there is provided an imaging pyrometer for generating a first and a second image from an object, the first image representing a visual image of the object and the second image representing a temperature distribution of the object, the imaging pyrometer comprising a circuit arrangement having an array of first sensor elements and an array of second sensor elements, the first and second sensor elements generating a plurality of first and second electrical signals as a function of electromagnetic radiation impinging on the circuit arrangement, wherein the first sensor elements are designed to generate the first electrical signals in a manner dependent on electromagnetic radiation from a first wavelength range comprising a large part of visible light, wherein the second sensor elements are designed to generate the second electrical signals in a manner dependent on electromagnetic radiation from a second wavelength range predominantly comprising infrared radiation, and wherein the first wavelength range overlaps the second wavelength range and therefore also comprises infrared radiation.

The novel circuit arrangement and image pyrometer are based on the concept, known per se, of recording electromagnetic radiation from two different wavelength ranges. The surface temperature of objects in the observed scene can then be determined by evaluating a quotient. The emission properties of the surface are eliminated on account of the quotient formation. In contrast to numerous circuit arrangements from the prior art, however, the novel circuit arrangement uses two broadband wavelength ranges which overlap in the range of infrared radiation. In addition, the first wavelength range also contains a large part of visible light. As surprisingly has turned out, it is possible to determine temperature according to the known quotient method with high accuracy despite the wavelength ranges overlapping in the infrared range. In addition, the novel circuit arrangement also provides signals from the visible wavelength range. Therefore, the novel circuit arrangement not only allows a temperature to be determined, but it also provides signals for generating an optical image (a conventional camera image) of the observed scene.

In contrast to the circuit arrangement of EP 1 134 565 B1 mentioned in the introduction, the novel circuit arrangement manages with two different types of sensor elements. Consequently, it is simpler and more cost-effective to realize. In preferred exemplary embodiments, the first sensor elements are realized without specific filters, which means they record electromagnetic radiation from substantially the entire wavelength range that can generally be detected with the materials used. In other words, specific filters are preferably dispensed with in the case of the first sensor elements, which allows a particularly simple and cost-effective design.

Since only two different types of sensor elements are required, sensor elements of the same type can be arranged more densely alongside one another on the surface of a matrix-like image sensor, which allows a higher resolution. Consequently, geometrical properties of an observed object can be determined from the recorded images with higher accuracy. In principle, however, the novel circuit arrangement can be used not only in the case of matrix-like image sensors but also in the case of pyrometers having just two sensor elements or a small number of first and second sensor elements.

For determining temperature according to the quotient method, the novel circuit arrangement makes use of the fact that the first and the second wavelength ranges recorded by means of the first and second sensor elements are different from one another. Consequently, the first and second sensor elements supply different electrical signals even if they are oriented at one and the same point within the observed scene. The different signals allow to determine temperature according to the quotient method even though the first and the second wavelength ranges overlap in the range of infrared radiation.

In a preferred configuration, the novel circuit arrangement or pyrometer has a circuit part designed to determine a temperature of the scene in a manner dependent on the first and second signals.

In this configuration, the circuit part receives the first and second electrical signals and it carries out a quotient formation in order to eliminate emission properties of surfaces in the observed scene. This method, known per se for determining the temperature of a radiating surface, can be realized in a very simple and cost-effective manner with the novel circuit arrangement. In the preferred configuration, the circuit part for determining the temperature is a part of the novel circuit arrangement. As an alternative to this, however, the novel circuit arrangement could be used separately from the circuit part, for example for simultaneously recording visual images and infrared images.

In a further configuration, the circuit arrangement or pyrometer comprises a semiconductor substrate, on which a plurality of first and second sensor elements are arranged side by side.

Preferably, the first and second sensor elements are arranged side by side in a matrix-like manner. They form an image sensor comprising an array of pixels. The first and second sensor elements can be arranged alternately in the manner of a checkerboard pattern on the surface of the semiconductor substrate. In other exemplary embodiments, the first and second sensor elements alternate line by line or column by column. These configurations allow rapid and temporally synchronous recording of areal images of an observed scene both in the range of visible light and in the infrared range. Good assignment of the different images to one another is possible as a result of the synchronous recording.

In a further configuration, the first and second sensor elements are arranged one above the other.

This configuration be used very advantageously in combination with the preceding configuration, but it can also be used without the preceding configuration. In the latter case, the novel circuit arrangement has just one or a few first and second sensor elements, which can be used for a spot-like, selective measurement in a scene for instance. In the former case, a first and a second sensor element arranged one above the other in stacked fashion, with a plurality of such pairs of stacked first and second sensor elements being arranged side by side in a matrix-like manner. In this case, each pair of first and second sensor elements forms a pixel of the matrix sensor, which enables a very high resolution. It is advantageous that the material layers which form the top sensor element of each stack already have a filter effect with regard to the radiation that reaches the bottom sensor element. In addition, all the sensor elements can be produced in common process steps, which simplifies the production of the novel circuit arrangement overall. However, even if the novel circuit arrangement is not used for a matrix sensor, this configuration enables a very small sensor, where the first and second sensor elements can be oriented at identical measurement points within the observed scene.

In a further preferred configuration, the first and second sensor elements each comprise a photodiode and at least one MOS transistor having a gate terminal, two further terminals and a channel, wherein the photodiode is coupled to the MOS transistor in such a way that charge carriers generated in the photodiode drain into the channel, and wherein the gate terminal is conductively connected to one of the two further terminals.

In this configuration, the first and second sensor elements preferably are constructed in accordance with the HDRC® principle as described in DE 42 09 536 A1 mentioned in the introduction. The MOS transistor is advantageously operated in the sub-threshold range, such that the sensor elements each have a logarithmic characteristic curve. This configuration has a number of advantages. First, it makes it possible to replace the quotient formation, which is advantageous for determining temperature, by difference formation because the difference between logarithmized signals corresponds to the logarithm of the quotient of the signals. Difference formation can be realized more simply and more rapidly than "genuine" quotient formation. Furthermore, this configuration has the advantage that the first and second sensor elements have a very large input dynamic range up to 120 dB. In other words, the first and second sensor elements can detect and process electromagnetic radiation having very low intensity and also electromagnetic radiation having very high intensity. This is highly advantageous for an imaging pyrometer because the high signal dynamic range makes it possible to record very bright, radiation-intensive objects in direct proximity to dark, low-radiation objects or areas. It is particularly advantageous if the novel circuit arrangement also comprises a primary signal processing of the first and second signals on the same semiconductor chip on which the first and second sensor elements are also realized. The primary signal processing advantageously comprises an analog-to-digital conversion, such that digital first and second signals are available at the output of the sensor for further processing. Overall, this configuration enables very accurate image recording and temperature measurement over a very large dynamic range.

In a further configuration, the first wavelength range substantially completely overlaps the second wavelength range.

In this configuration, the second wavelength range is a subrange of the first wavelength range. This configuration enables the first and second sensor elements to be realized very simply and cost-effectively since the two sensor elements can be constructed identically, in principle, and differ from one another only by virtue of one or more additional filters for the second sensor elements.

In a further configuration, the second sensor element comprises a cut-off filter, which defines a lower limit of the second wavelength range. In preferred exemplary embodiments, said lower limit lies between approximately 660 nm and approximately 740 nm, preferably between approximately 680 nm and approximately 720 nm, and even more preferably in the region of approximately 700 nm.

A cut-off filter for the purposes of this configuration is a filter which causes a transmission jump that defines the lower limit of the second wavelength range. The specified wavelengths and wavelength ranges are preferred because, on the one hand, they can be realized cost-effectively and, on the other hand, they yield good measurement results in particular for the temperature determination. The use of a cut-off filter enables a very simple and cost-effective realization of the second sensor elements on the same semiconductor substrate on which the first sensor elements are arranged.

In a further configuration, the cut-off filter is a dielectric interference filter having a plurality of material layers arranged one above another, wherein said material layers are formed substantially from silicon and silicon nitride. In one preferred exemplary embodiment, the interference filter consists of two silicon nitride layers between which a silicon layer is arranged.

This configuration enables very simple and cost-effective production of the interference filter within a process sequence that is also used to produce the first and second sensor elements on a semiconductor substrate. A cut-off filter having the specified layer sequence comprising silicon nitride and silicon can be produced very simply and cost-effectively and has enabled very good measurement results in exemplary embodiments of the invention.

In a further configuration, the lower limit is located substantially centrally with respect to the first wavelength range.

This configuration also contributes to simple and cost-effective production of the novel circuit arrangement. In addition, very good measurement results can be achieved with this configuration. It is advantageous, here that the energy distributions in the two wavelength ranges formed are very well suited to quotient formation since the detectable photon fluxes increase at higher wavelengths.

In a further configuration, the novel circuit arrangement has at least one further temperature-sensitive sensor element, which is shielded from the electromagnetic radiation from the first and second wavelength ranges.

In preferred exemplary embodiments, the further temperature-sensitive sensor element is a diode through which a measurement current flows. The temperature-sensitive behavior of said diode makes it possible to correct a temperature-dependent drift of the first and second sensor elements by calibrating the first and second signals with respect to the temperature. It is particularly advantageous if the further temperature-sensitive sensor element is realized with the aid of one or more diodes which are often present as so-called process control structures in the edge region of an image sensor. It is sufficient to arrange material layers above such a process control structure, which material layers shield the electromagnetic radiation from the first and second wavelength ranges, such as a metallization layer for instance. In preferred exemplary embodiments, the temperature compensation of the first and second signals is carried out in the same way as an FPN (fixed pattern noise) correction in the case of an image sensor comprising a plurality of sensor elements arranged side by side in a matrix-like manner. This configuration enables very high measurement accuracies during the temperature measurement.

It goes without saying that the features mentioned above and those yet to be explained below can be used not only in the combination respectively specified, but also in other combinations or by themselves, without departing from the scope of the present invention.

BRIEF DESCRIPTION OF THE DRAWINGS

Exemplary embodiments of the invention are illustrated in the drawing and are explained in greater detail in the description below. In the Figures.

DESCRIPTION OF PREFERRED EMBODIMENTS

Figure 1:
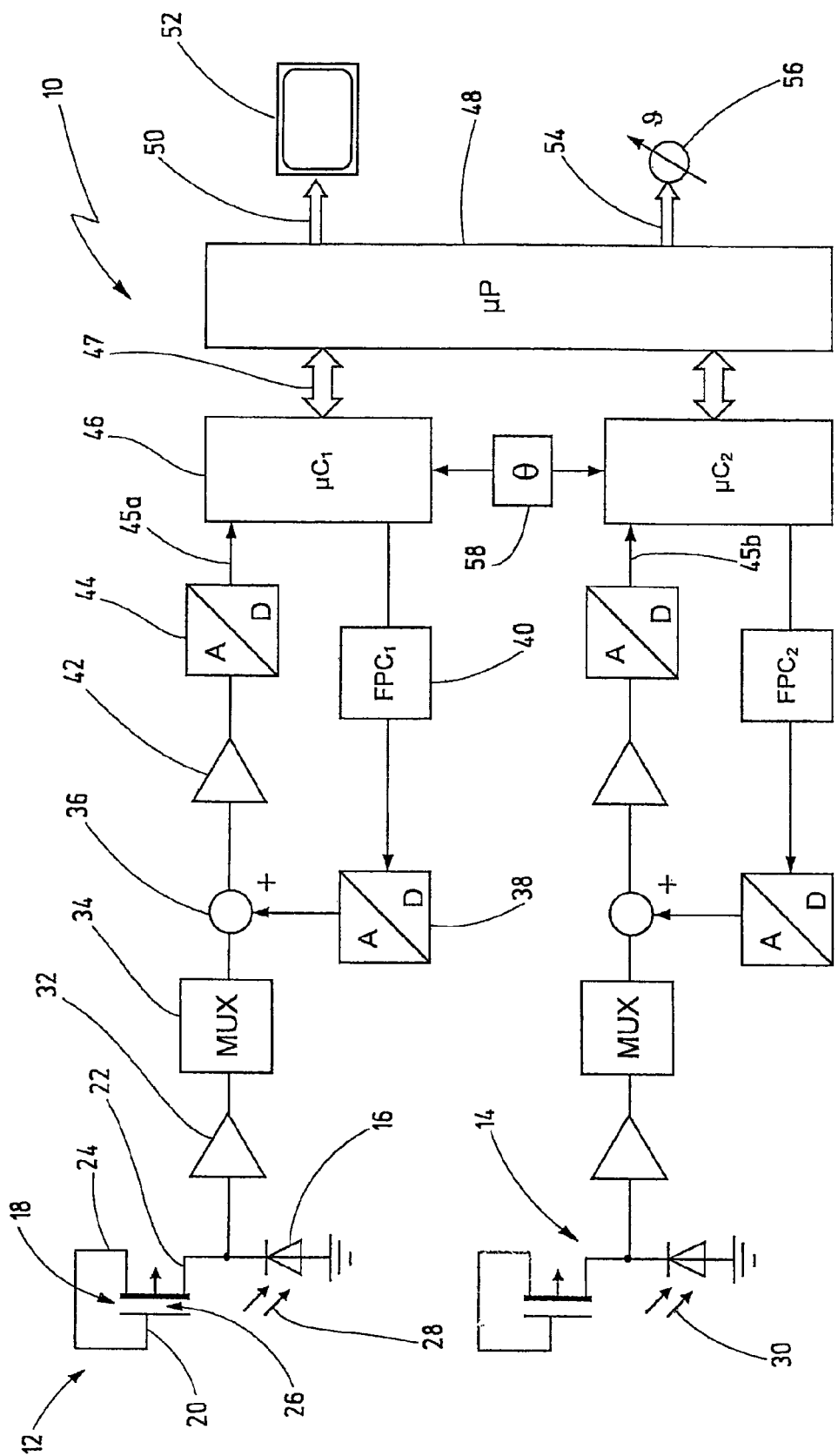
FIG. 1 shows a schematic illustration of an exemplary embodiment of the novel circuit arrangement.

In FIG. 1, an exemplary embodiment of the novel circuit arrangement is designated by reference numeral 10 in its entirety.

The circuit arrangement 10 is illustrated here with a first sensor element 12 and a second sensor element 14. Each of said sensor elements has a photodiode 16 and a MOS transistor 18. The MOS transistor 18 has a gate 20 and two further terminals 22, 24, which are usually designated as source and as drain. In the preferred exemplary embodiment, the gate terminal 20 and the drain terminal 24 are short-circuited. The source terminal 22 is connected to the cathode of photodiode 16. On account of this arrangement, charge carriers which are generated in the region of the pn junction of the photodiode 16 as a result of impinging electromagnetic radiation 28, 30 drain into and through the channel 26 of the MOS transistor 18, and the MOS transistor 18 generates an output voltage having a magnitude which is logarithmically dependent on the intensity of the electromagnetic radiation.

The sensor elements 12, 14 are illustrated in simplified fashion here. Further advantageous details are described in DE 42 09 536 A1, which discloses the basic principle of the logarithmic image cells marketed by the applicant of the present invention under the designation HDRC®. In the preferred exemplary embodiments of the present invention, all the sensor elements are constructed according to this HDRC® principle. However, the sensor elements can, in principle, also be realized in a different way, for example as linear CMOS image cells or as CCD image cells.

Figure 2:
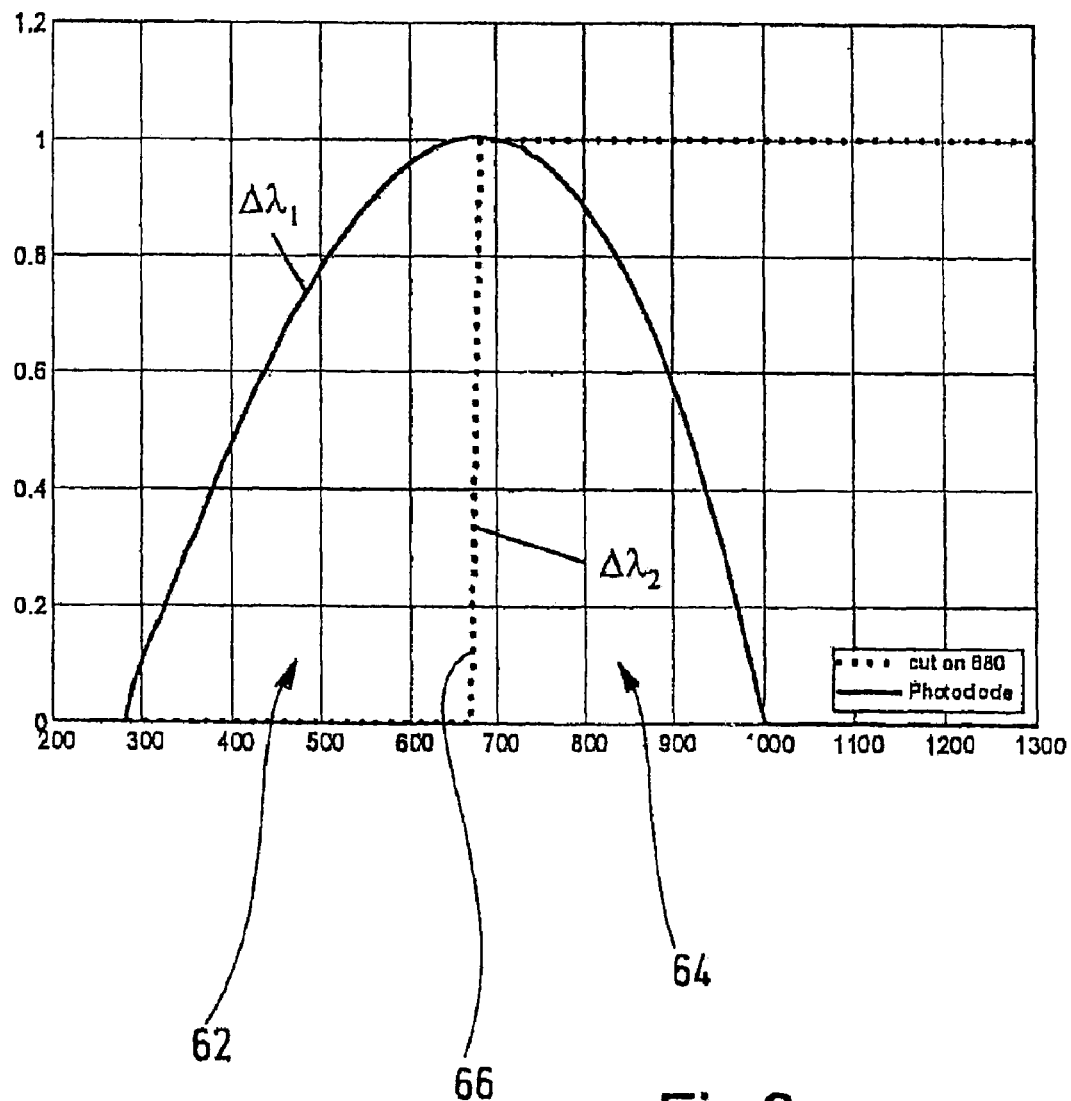
FIG. 2 shows a spectral diagram for illustrating preferred exemplary embodiments of the novel circuit arrangement.

Only two sensor elements 12, 14 are illustrated in FIG. 1. In preferred exemplary embodiments, however, the novel circuit arrangement 10 has a plurality of first and second sensor elements 12, 14, which are not illustrated in FIG. 1 for the sake of simplicity. In preferred exemplary embodiments, the plurality of sensor elements 12, 14 are arranged on a semiconductor substrate, as explained below with reference to FIGS. 2 to 4.

In the exemplary embodiment of FIG. 1, an impedance converter 32 is arranged at the output of each sensor element 12, 14, the output of said impedance converter being connected to a multiplexer 34. With the aid of the multiplexer 34 it is possible to feed a plurality of electrical signals to a common signal processing circuit. In one preferred exemplary embodiment, which is illustrated in FIG. 1, a first multiplexer 34 is used to combine the electrical signals of the first sensor elements 12, while a second multiplexer is used to combine the electrical signals of the second sensor elements 14. In preferred exemplary embodiments, the novel circuit arrangement 10 has two parallel signal processing channels, wherein one signal processing channel processes the electrical signals of the first sensor elements 12, while the other signal processing channel processes the electrical signals of the sensor elements 14. The two signal processing channels are preferably constructed identically, for which reason only the signal processing channel for the first sensor elements 12 is explained in greater detail below.

The output of the multiplexer 34 is connected to an adder 36. The adder 36 receives a further electrical signal from a D/A converter 38, said signal serving for the correction of fixed pattern noise in a manner known per se. Fixed pattern noise denotes image inhomogeneity (noise) which can occur in the case of an image sensor comprising a plurality of sensor elements because the electrical properties of the individual sensor elements vary on account of manufacturing tolerances. The fixed pattern noise can be corrected by an individual correction signal respectively being added to the electrical signals of the individual sensor elements. The correction signal is chosen such that the electrical properties of the individual sensor elements are matched to one another. Correction coefficients for generating these correction signals are in this case stored in a memory 40 connected to a D/A converter 38. The D/A converter 38 generates the correction signals for each sensor element on the basis of the correction coefficients from the memory 40.

The output of the adder 36 is connected via an amplifier 42 to an A/D converter 44, which converts the corrected analog signals of the individual sensor elements into corresponding digital signals 45. The digital signals 45 are fed to a microcontroller 46. Instead of a microcontroller, it is also possible to use an ASIC, an FPGA or some other signal processing circuit. The microcontroller 46 in this case also serves to write the correction coefficients for the FPN correction to the memory 40.

The microcontroller 46 is in this case connected via an interface 47 to a processor 48. The processor 48 receives the electrical signals 45 of all the first and second sensor elements 12, 14 and calculates therefrom, inter alia, temperature values according to the known quotient method. At an output 50, the processor 48 provides digital signals for display on a screen 52. In preferred exemplary embodiments, the screen 52 serves to display an optical image of the observed scene in the visible wavelength range. At an output 54, the processor 48 provides signals representing the calculated temperatures. The output 54 can be connected to a further display 56. As an alternative thereto, the image data and temperature values can be displayed alternately or jointly on the screen 52.

The reference numeral 58 designates a further temperature-sensitive sensor element, which is shielded from electromagnetic radiation 28, 30 in preferred exemplary embodiments. For the case where the first and second sensor elements 12, 14 are image cells (pixels) of a matrix image sensor, it is preferred if the further sensor element 58 is realized in the form of one or more diodes arranged in the edge region of the light-sensitive area of the sensor. The further sensor element 58 generates temperature information that is representative of the intrinsic temperature of the sensor. In preferred exemplary embodiments of the novel circuit arrangement, this temperature information is used by controllers 46 in order to correct the electrical signals 45 of the individual sensor elements 12, 14 computationally in such a way that signal changes on account of temperature drift of the individual sensor elements are compensated for.

In accordance with the preferred use of the novel circuit arrangement for an imaging pyrometer, the first and second sensor elements 12, 14 are designed for recording electromagnetic radiation 28, 30 from different wavelength ranges. In the preferred exemplary embodiment, the first sensor elements 12 are designed in such a way that they record electromagnetic radiation 28 from a first wavelength range 62, which is represented by a solid line in the diagram in FIG. 2. In a preferred exemplary embodiment, the first wavelength range 62 comprises wavelengths from approximately 280 nm to approximately 1000 nm. The maximum transmission of this first wavelength range is at approximately 680 nm. Such a transmission characteristic of the first sensor elements arises if the photodiodes 16 of the first sensor elements 12 are realized as near-surface pn junctions in a silicon semiconductor material. However, these limits are not defined exactly, but rather depend on the materials and process conditions used. In preferred exemplary embodiments of the novel circuit arrangement, the first wavelength range 62 is that wavelength range which arises on account of the spectral sensitivity of silicon photodiodes which are realized without specific filters.

The second sensor elements 14 are designed to record electromagnetic radiation 30 from a second wavelength range 64, which is different from the first wavelength range 62. In the preferred exemplary embodiment, the second wavelength range is the "upper half" of the first wavelength range 62. In the preferred exemplary embodiments, the second wavelength range 64 results from the fact that the photodiodes of the second sensor elements 14 are provided with an additional cut-off filter, the transmission characteristic of which is represented at the dotted line 66 in FIG. 2. The transmission jump (cut on) here is at approximately 680 nm. Electromagnetic radiation having wavelengths of below 680 nm is suppressed by the cut-off filter. Only electromagnetic radiation having wavelengths above approximately 680 nm reaches the photodiodes of the second sensor elements 14.

Figure 3:
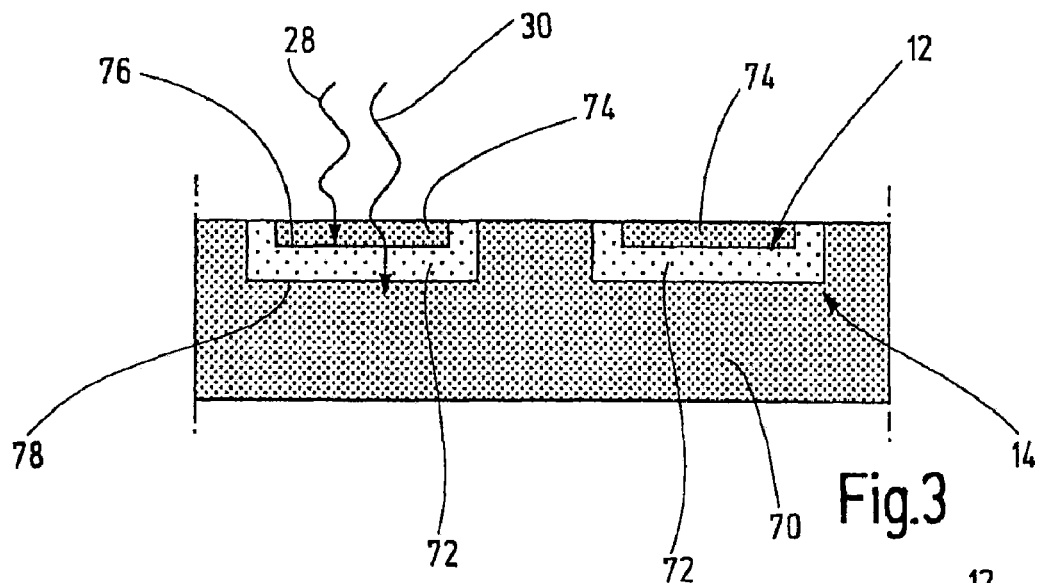
FIG. 3 shows a first exemplary embodiment for the realization of the first and second sensor elements.

FIG. 3 shows a first exemplary embodiment for the realization of the sensor elements 12, 14. Identical reference symbols designate the same elements as before.

FIG. 3 shows an excerpt from a semiconductor substrate 70, which is illustrated in cross section. By way of example, the semiconductor substrate 70 is in this case a p-doped silicon substrate or a p-doped well in a semiconductor substrate. n-doped islands 72 are arranged in the p-doped substrate 70. A further p-doped layer 74 is arranged at the top side of each island 72. Consequently, two pn junctions 76, 78 are formed, the pn junction 76 lying above pn junction 78. pn junction 76 forms the photodiode 16 of the first sensor element 12, while pn junction 78 forms the photodiode 16 of the second sensor element 14. The longer-wave radiation 30 penetrates more deeply into the semiconductor material and thus reaches the deeper pn junction 78, while the shorterwave radiation 28 only reaches upper pn junction 76. In this exemplary embodiment, the layers of upper pn junction 76 form a filter for the lower pn junction 78. The position of pn junctions 76, 78 is chosen here in a manner dependent on the penetration depth of the radiation to be detected. As is illustrated in FIG. 3, a plurality of such photodiodes stacked one above another are arranged side by side in the semiconductor substrate 70. In this exemplary embodiment, the sensor elements 12, 14 in each case jointly form the individual pixels of the matrix sensor. It goes without saying that each pixel additionally comprises the MOS transistors and—in preferred exemplary embodiments—further components, such as the impedance converter 32, for instance. These further components are not illustrated here, for the sake of simplicity.

Figure 4:
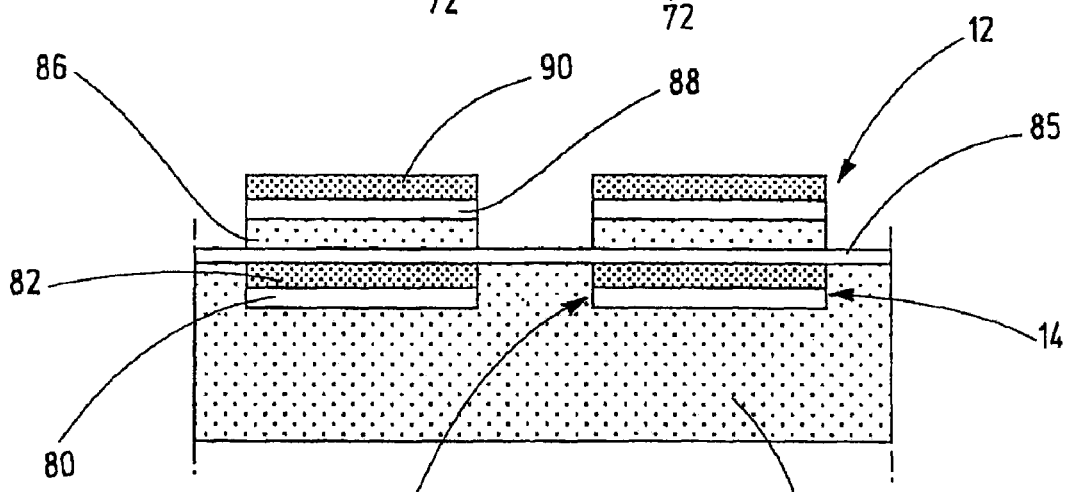
FIG. 4 shows a further exemplary embodiment for the realization of the first and second sensor elements.

FIG. 4 shows a further exemplary embodiment of how first and second sensor elements 12, 14 stacked one above the other can be realized. In this exemplary embodiment, the sensor elements 12, 14 are realized by way of example on an n-doped substrate 70'. Arranged in the n-doped substrate 70' are a plurality of intrinsically conductive (depletion mode) layers 80, with p-doped layers 82 lying above the latter. In this way, a plurality of pin diodes 84 are formed, which serve as photodiodes for the second sensor elements 14. A continuous insulation layer 85 of silicon dioxide is arranged above pin diodes 84. A plurality of further pin diodes having a layer sequence of n-doped silicon 86, intrinsically conductive silicon 88 and p-doped silicon 90 are arranged on the insulation layer 85. The pin diodes having the layer sequence 86, 88, 90 form the first sensor elements 12. Preferably, the layers 86, 88, 90 are produced with the aid of a CVD method. A realization in accordance with the exemplary embodiment in FIG. 4 has the advantage that the photodiodes of the sensor elements 12, 14 are stacked one above another, but are electrically isolated from one another by the insulation layer 85. The photodiodes of the two sensor elements 12, 14 are potential-free as a result of the insulation and can therefore be connected up in any desired manner. By contrast, the islands 72 in the exemplary embodiment of FIG. 3 form a common cathode terminal of the two photodiodes for the sensor elements 12, 14.

Figure 5:
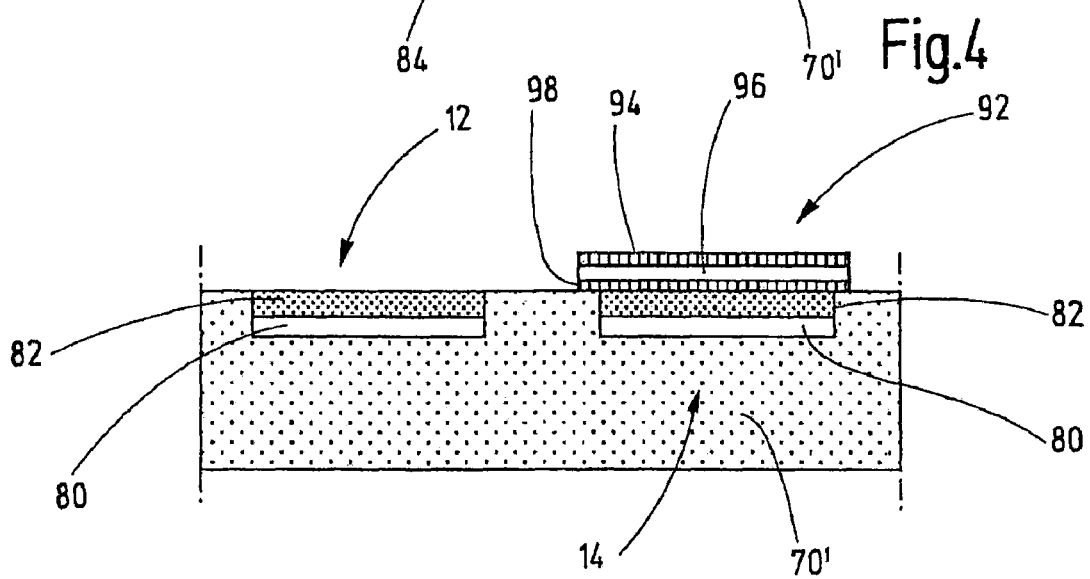
FIG. 5 shows yet another exemplary embodiment for the realization of the first and second sensor elements.

FIG. 5 shows another exemplary embodiment, in which the photodiodes of the sensor elements 12, 14 are not arranged vertically one above another, but rather horizontally side by side. In this case, the photodiodes of the sensor elements 12, 14 are constructed substantially identically. The exemplary embodiment again involves pin photodiodes having layers 80, 82 arranged in an n-doped silicon substrate 70". In order to achieve the different spectral sensitivities, a respective filter 92 is arranged above the photodiodes for the second sensor elements 14, the filter characteristic of said filter corresponding to the dotted line 66 from FIG. 2. In preferred exemplary embodiments, the filter 92 is realized as a dielectric interference filter, and it has an upper layer 94 of silicon nitride, a middle layer 96 of silicon, and a lower layer 98 of silicon nitride. The layers 94 to 98 can again be produced with the aid of a CVD method.

In exemplary embodiments according to FIG. 5, the sensor elements 12, 14 can be arranged at the surface of the semiconductor substrate 70' alternately line by line or column by column, or in the manner of a checkerboard pattern. In comparison with a sensor according to the exemplary embodiments of FIG. 3 or 4, the resolution is lower. Each sensor element 12, 14 here forms a dedicated pixel of the matrix sensor. On the other hand, the sensor elements 12, 14 here can be produced in common process steps. To conclude the process sequence it is sufficient to cover the photodiodes of the second sensor elements 14 with the layers 94 to 98.

What is claimed is:

1. A circuit arrangement for generating light-dependent and temperature-dependent signals representing properties of a scene, the circuit arrangement comprising:
    a number of first and second sensor elements which generate a number of first and second electrical signals that are dependent on impinging electromagnetic radiation from a surface located in the scene, said surface having unknown emission properties, and
    a circuit part designed to determine a temperature as a function of the first and second signals,
    wherein the first sensor elements are designed to generate the first electrical signals in a manner dependent on electromagnetic radiation from a first wavelength range comprising visible light and infrared radiation,
    wherein the second sensor elements are designed to generate the second electrical signals in a manner dependent on electromagnetic radiation from a second wavelength range predominantly comprising infrared radiation,
    wherein the first wavelength range overlaps the second wavelength range such that the second wavelength range is a subrange of the first wavelength range, and
    wherein the circuit part is further designed to form a quotient from the first and second signals in order to eliminate any influence of the emission properties in the process of determining the temperature.

2. The circuit arrangement of claim 1, further comprising a semiconductor substrate, on which a plurality of first and second sensor elements are arranged side by side.

3. The circuit arrangement of claim 1, wherein the first and second sensor elements are arranged one above the other.

4. The circuit arrangement of claim 1, wherein the first and second sensor elements each comprise a photodiode and at least one MOS transistor having a gate terminal, two further terminals and a channel, wherein the photodiode is coupled to the MOS transistor in such a way that charge carriers generated in the photodiode drain into the channel, and wherein the gate terminal is conductively connected to one of the two further terminals.

5. The circuit arrangement of claim 1, wherein the first wavelength range substantially completely overlaps the second wavelength range.

6. The circuit arrangement of claim 1, wherein the second sensor element comprises a cut-off filter which defines a lower limit of the second wavelength range.

7. The circuit arrangement of claim 6, wherein the cut-off filter is a dielectric interference filter having a plurality of material layers arranged one above another, wherein the material layers are formed substantially from silicon and silicon nitride.

8. The circuit arrangement of claim 6, wherein the lower limit is located approximately centrally with respect to the first wavelength range.

9. The circuit arrangement of claim 1, further comprising at least one further temperature-sensitive sensor element which is shielded from the electromagnetic radiation from the first and second wavelength ranges.

10. A circuit arrangement for generating a first and a second image from an object having defined emission properties, the first image representing a visual image of the object and the second image representing a temperature distribution of the object, the circuit arrangement comprising:
    an array of first and second sensor elements each configured for receiving electromagnetic radiation and for generating electrical signals depending on the electromagnetic radiation, and
    a circuit part for processing the electrical signals from the first and second sensor elements in order to generate the first and second images,
    wherein the electromagnetic radiation comprises a plurality of wavelengths defining a first and a second range of wavelengths,
    wherein the first and second sensor elements each comprise a photodiode and at least one MOS transistor having a gate terminal, two further terminals and a channel, the gate terminal being conductively connected to one of the two further terminals, and the photodiode being coupled to the MOS transistor so as to drain charge carriers generated in the photodiode on account of the electromagnetic radiation into the channel in order to produce the electrical signals,
    wherein the first sensor elements are designed to generate a plurality of first electrical signals as a function of the electromagnetic radiation from the first range of wavelengths,
    wherein the second sensor elements are designed to generate a plurality of second electrical signals as a function of the electromagnetic radiation from the second range of wavelengths,
    wherein the first range of wavelengths completely overlaps the second range of wavelengths and comprises wavelengths representing both visible light and infrared radiation, and
    wherein the second range of wavelengths comprises wavelengths representing mainly infrared radiation, and
    wherein the circuit part is designed to form a quotient from the first and second signals in order to determine the temperature distribution independent from the emission properties.

11. The circuit arrangement of claim 10, wherein the first range of wavelength ranges from approximately 280 nm to approximately 1000 nm.

12. The circuit arrangement of claim 10, wherein the second range of wavelength ranges from approximately 680 nm to approximately 1000 nm.

13. An imaging pyrometer for generating a first and a second image from an object, the first image representing a visual image of the object and the second image representing a temperature distribution of the object, the imaging pyrometer comprising a circuit arrangement having an array of first sensor elements and an array of second sensor elements, the first and second sensor elements generating a plurality of first and second electrical signals as a function of electromagnetic radiation impinging on the circuit arrangement, and comprising a circuit part designed to determine the temperature distribution as a function of the first and second signals, wherein the first sensor elements are designed to generate the first electrical signals in a manner dependent on electromagnetic radiation from a first wavelength range comprising infrared radiation and visible light, wherein the second sensor elements are designed to generate the second electrical signals in a manner dependent on electromagnetic radiation from a second wavelength range predominantly comprising infrared radiation, wherein the first wavelength range completely overlaps the second wavelength range, but is different from the second wavelength range, and wherein the circuit part is designed to form a quotient from the first and second signals in order to determine the temperature distribution.

14. The imaging pyrometer of claim 13, further comprising a semiconductor substrate, on which a plurality of first and second sensor elements are arranged side by side in a matrix fashion.

15. The imaging pyrometer of claim 13, wherein the first and second sensor elements are arranged one above the other.

16. The imaging pyrometer of claim 13, wherein the first and second sensor elements each comprise a photodiode and at least one MOS transistor having a gate terminal, two further terminals and a channel, wherein the photodiode is coupled to the MOS transistor in such a way that charge carriers generated in the photodiode drain into the channel, and wherein the gate terminal is conductively connected to one of the two further terminals.

17. The imaging pyrometer of claim 13, wherein the first wavelength range has a lower half and an upper half, the second wavelength range corresponding to the upper half.

\* \* \* \* \*